US009172165B1

(12) United States Patent
Sass et al.

(10) Patent No.: US 9,172,165 B1
(45) Date of Patent: Oct. 27, 2015

(54) MEMORY MODULE CONNECTOR ASSEMBLY

(71) Applicant: International Business Machines Corporation, Armonk, NY (US)

(72) Inventors: Tony C. Sass, Fuquay Varina, NC (US); Derek I. Schmidt, Raleigh, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/325,972

(22) Filed: Jul. 8, 2014

(51) Int. Cl.
*H01R 24/00* (2011.01)
*H01R 12/72* (2011.01)

(52) U.S. Cl.
CPC .................... *H01R 12/721* (2013.01)

(58) Field of Classification Search
CPC .......... H01R 23/7068; H01R 23/6886; H01R 23/725; H01R 23/70; H01R 31/00; H01R 23/7073; H01R 23/6873; H01R 23/025; H01R 13/514; H01R 27/02; H01R 23/7005; H01R 13/631; H01R 23/7084; H01R 12/57; H01R 13/26; G06K 7/0047; H05K 7/1418; G06F 1/184
USPC ................... 439/631, 541.5, 64, 377, 79, 637
See application file for complete search history.

(56) References Cited

U.S. PATENT DOCUMENTS

| 5,882,211 | A | 3/1999 | Choy et al. |
| 6,179,651 | B1 | 1/2001 | Huang |
| 6,246,588 | B1 | 6/2001 | Kim et al. |
| 6,385,053 | B1 | 5/2002 | Parizi et al. |
| 7,261,592 | B2 | 8/2007 | Korsunsky et al. |
| 7,445,497 | B2 | 11/2008 | Zhang |
| 7,556,527 | B2 | 7/2009 | Li et al. |
| 7,841,895 | B2 | 11/2010 | Zhu et al. |
| 8,232,962 | B2 | 7/2012 | Buck |
| 8,488,326 | B2 | 7/2013 | Nguyen |

FOREIGN PATENT DOCUMENTS

EP 1065752 A1 1/2001

*Primary Examiner* — Abdullah Riyami
*Assistant Examiner* — Vladimir Imas
(74) *Attorney, Agent, or Firm* — Katherine S. Brown; Jeffrey L. Streets (57) ABSTRACT

An apparatus includes a memory module connector assembly physically secured along an edge of a printed circuit board. The printed circuit board includes a first plurality of contacts on a first surface of the printed circuit board and a second plurality of contacts on a second surface of the printed circuit board. The memory module connector assembly includes a first edge connector socket for receiving a first memory module, a second edge connector socket for receiving a second memory module, a first plurality of electrical leads electrically connecting contacts within the first edge connector socket to the first plurality of contacts on the first side of the printed circuit board, and a second plurality of electrical leads electrically connecting contacts within the second edge connector socket to the second plurality of contacts on the second side of the printed circuit board.

18 Claims, 6 Drawing Sheets

MEMORY MODULE CONNECTOR ASSEMBLY

BACKGROUND

1. Field of the Invention

The present invention relates to a memory module connector secured to a printed circuit board for receiving a memory module.

2. Background of the Related Art

Packaging density of memory modules is important for many electronic systems, such as computer servers. A high packaging density of memory modules, such as small outline memory modules, may be provided by nesting two connectors in close proximity on one surface a printed circuit board. For example, a lower connector might be at a seating height of 5.2 mm above the surface of the main printed circuit board and an upper connector might be at a seating height of 9.2 mm above the surface of the printed circuit board and somewhat offset from the lower connector. The stacked connectors provide two sockets that accommodate two stacked memory modules. Moreover, the stacked connectors are of a type that require insertion and rotation of a memory module, which provides electrical contact between pads on an edge of the memory module and corresponding contacts within the connector with any contact wipe.

BRIEF SUMMARY

One embodiment of the present invention provides an apparatus comprising a memory module connector assembly physically secured along an edge of a printed circuit board. The printed circuit board includes a first plurality of contacts on a first surface of the printed circuit board and a second plurality of contacts on a second surface of the printed circuit board. The memory module connector assembly includes a first edge connector socket for receiving a first memory module, a second edge connector socket for receiving a second memory module, a first plurality of electrical leads electrically connecting contacts within the first edge connector socket to the first plurality of contacts on the first side of the printed circuit board, and a second plurality of electrical leads electrically connecting contacts within the second edge connector socket to the second plurality of contacts on the second side of the printed circuit board.

DETAILED DESCRIPTION

One embodiment of the present invention provides an apparatus comprising a memory module connector assembly physically secured along an edge of a printed circuit board. The printed circuit board includes a first plurality of contacts on a first surface of the printed circuit board and a second plurality of contacts on a second surface of the printed circuit board. The memory module connector assembly includes a first edge connector socket for receiving a first memory module, a second edge connector socket for receiving a second memory module, a first plurality of electrical leads electrically connecting contacts within the first edge connector socket to the first plurality of contacts on the first side of the printed circuit board, and a second plurality of electrical leads electrically connecting contacts within the second edge connector socket to the second plurality of contacts on the second side of the printed circuit board.

The printed circuit board may be any printed circuit board in any type of electronic device that uses memory modules, such as a motherboard in a notebook computer or computer server. Preferably, the printed circuit board will secure a processor in electronic communication with the first plurality of contacts and the second plurality of contacts. The first and second memory modules may be any type of memory modules, such as dual inline memory modules or small outline memory modules.

The contacts on the surfaces of the printed circuit board are typically connected by electrically conductive traces or vias to one or more components, such as a processor, supported on the printed circuit board. Accordingly, the processor is able to store and retrieve data on the memory modules that are installed in the memory module connector assembly. The first plurality of electrical leads may be soldered to the first plurality of contacts on the first side of the printed circuit board, and the second plurality of electrical leads may be soldered to the second plurality of contacts on the second side of the printed circuit board.

The memory module connector assembly is preferably constructed with a body formed with a material that is an electrical insulator, such as a rigid plastic. The memory module connector assembly may also include first and second brackets, where each bracket includes a notch for receiving the edge of the printed circuit board. It should be further recognized that memory module connector assembly may include any number of two more edge connectors sockets, where each socket is associated with a plurality of electrical leads and corresponding contacts on a surface of the printed circuit board. However, the preferred number of sockets is two. Much of the description of the present invention is provided in the context of a memory module connector assembly having two (first and second) edge connector sockets, but the invention is not limited to just two edge connector sockets.

Furthermore, the first and second edge connector sockets preferably open in a direction away from the edge of the printed circuit board to which the memory module connector assembly is physically secured. Accordingly, the edge connector sockets are easily accessible for installing and removing memory modules, and each of the edge connector sockets may be closer to the plane of the printed circuit board than when edge connector sockets are stacked. Positioning the edge connector sockets close to the plane of the printed circuit board allows the electrical leads to be shorter. Still further, since edge connector sockets may be positioned on opposing sides of the plane defined by the printed circuit board, the electrical leads from the first socket to the printed circuit board may be the same length as the electrical leads from the second socket to the printed circuit board.

In various embodiments of the present invention, the printed circuit board may be planar, the first edge connector socket may be positioned on a first side of a plane defined by the printed circuit board, and the second edge connector socket may be positioned on a second side of a plane defined by the printed circuit board. Optionally, the first edge connector socket may be parallel to the second edge connector socket. In a further option, the first and second edge connector sockets may be parallel to the plane defined by the printed circuit board.

The first and second edge connector sockets may be straight plug edge connector sockets. Beneficially, a straight plug edge connector socket provides for a contact wipe to occur between the memory module pads and the contacts within the edge connector socket, such that resistive materials are wiped away and the reliability of the electrical connection is improved relative to connections that rely upon insertion and rotation.

In one non-limiting embodiment, the first edge connector socket includes first and second opposing rows of contacts for engaging opposing sides of the first memory module, the first plurality of electrical leads includes first and second rows of electrical leads, and the first plurality of contacts on the first surface of the printed circuit board includes first and second rows of contacts. The first row of electrical leads in the first plurality of electrical leads may electrically connect the first row of contacts in the first edge connector socket to the first row of contacts on the first surface of the printed circuit board and the second row of electrical leads may electrically connect the second row of contacts in the first edge connector socket to the second row of contacts on the first surface of the printed circuit board. In a further option, the second edge connector socket includes first and second opposing rows of contacts for engaging opposing sides of the second memory module, the second plurality of electrical leads includes first and second rows of electrical leads, and the second plurality of contacts on the second surface of the printed circuit board includes first and second rows of contacts. Accordingly, the first row of electrical leads in the second plurality of electrical leads may electrically connect the first row of contacts in the second edge connector socket to the first row of contacts on the second surface of the printed circuit board and the second row of electrical leads in the second plurality of electrical leads may electrically connect the second row of contacts in the second edge connector socket to the second row of contacts on the second surface of the printed circuit board.

In a further embodiment, the first edge connector socket may include a first key and the first memory module may include a first notch that only aligns with the first key when the first memory module is in a first orientation, whereas the second edge connector socket may include a second key and the second memory module may include a second notch that only aligns with the second key when the second memory module is in a second orientation. Preferably, the first and second keys only allow the first and second memory modules to be installed with the first memory module facing in an opposite direction from the second memory module.

Figure 1:
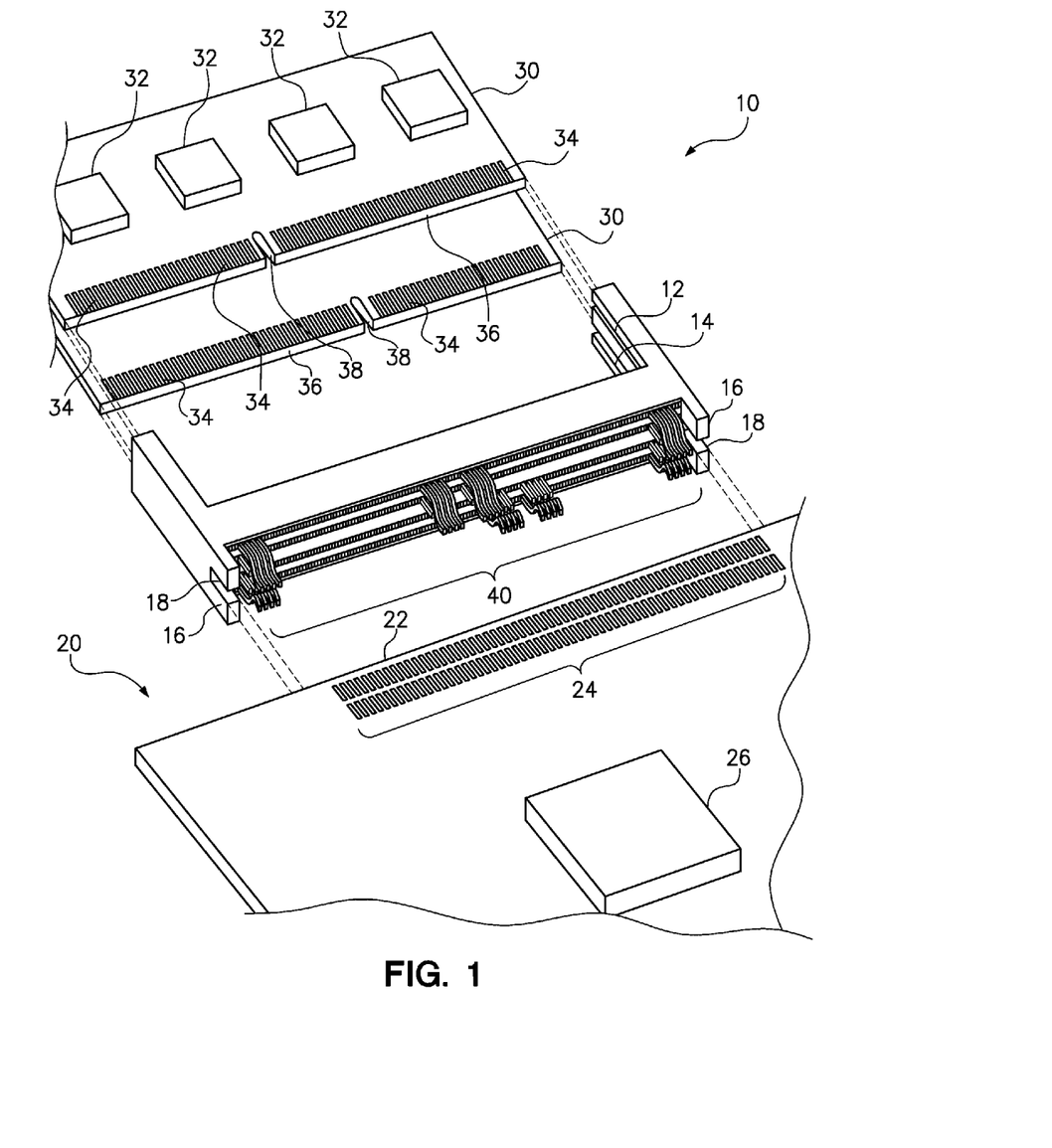
FIG. 1 is an assembly view of an edge connector assembly aligned for securing to a printed circuit board and adapted to receive two memory modules.

FIG. 1 is an assembly view of an edge connector assembly 10 aligned for securing to a printed circuit board 20 and adapted to receive two memory modules 30. The edge connector assembly 10 includes a first edge connector socket (not shown) aligned with a first pair of slots 12 (only one shown) for receiving a first one of the memory modules 30 and a second edge connector socket (not shown) aligned with a second pair of slots 14 (only one shown) for receiving a second one of the memory modules 30. While the two memory modules 30 are preferably the same, the lower memory module 30 is facing in the opposite direction as the upper memory module 30. The upper memory module shows the individual memory chips 32 secured to the surface of the memory module 30 and an array of electrically conductive pads 34 formed along an edge 36. As shown, the pads 34 may be formed on both surfaces (i.e., top and bottom surfaces) of the memory modules 30. While not shown in detail, it should be understood that the pads 34 are electrically connected to the memory chips 32 to form a functioning memory module 30. The exact number of pads 34 will vary according to the type of memory module. Furthermore, each memory module 30 may include one or more notch 38 that cooperates with a key (not shown) in the socket to assure that the memory module 30 is installed in the proper orientation.

The edge connector assembly 10 has first and second brackets 16 at opposite ends of the assembly, where each bracket 16 includes a notch 18 for receiving the edge 22 of the printed circuit board 20. The edge connector assembly 10 is positioned so that each of the electrical leads 40 on the edge connector assembly 10 come into electrical contact with a corresponding one of the contacts 24 on the printed circuit board 20. While not shown in detail, it should be understood that the contacts 24 may be electrically connected to a processor 26 so that the processor can communicate with the memory modules 30 through the edge connector assembly 10. Additional description of connections between the memory modules 30, edge connector assembly 10 and the printed circuit board 20 will follow.

Figure 2:
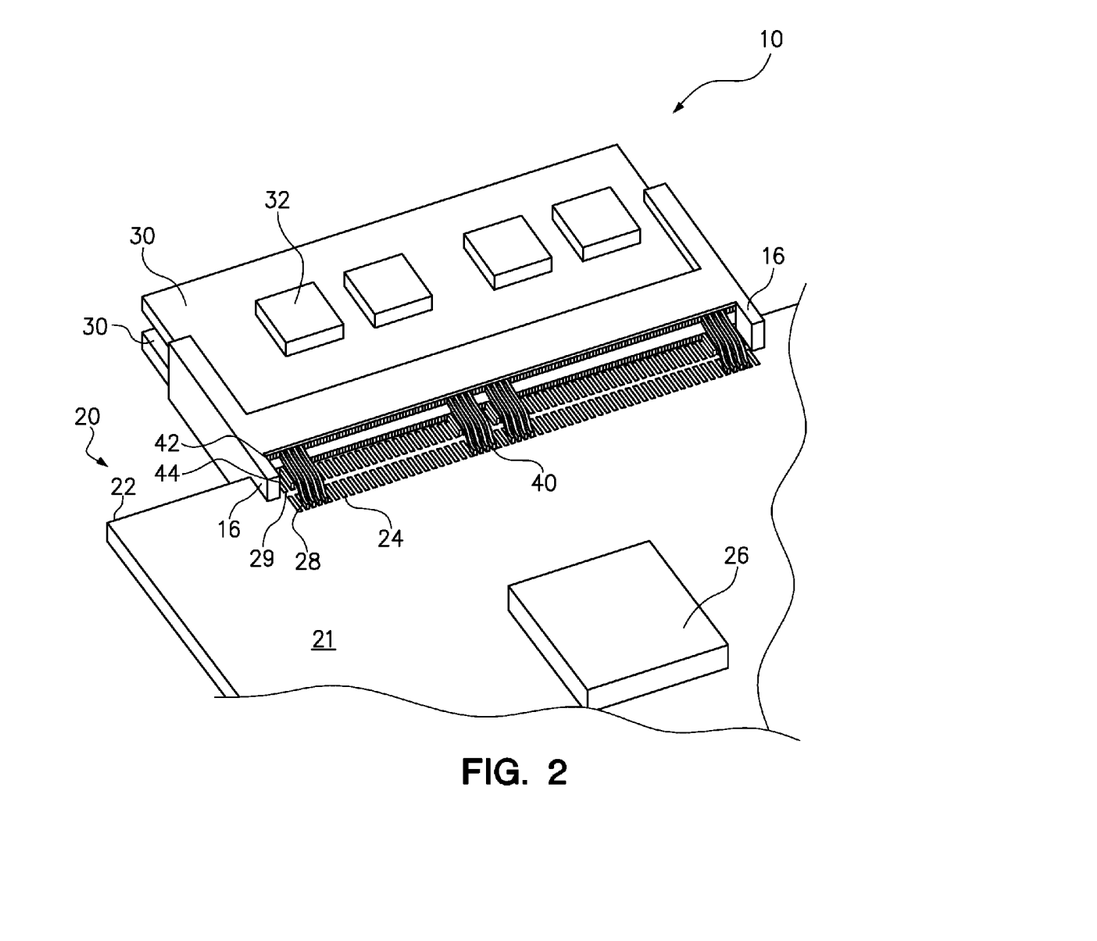
FIG. 2 is a perspective view of the edge connector assembly secured to the printed circuit board and having two memory modules installed.

FIG. 2 is a perspective view of the edge connector assembly 10 secured to the printed circuit board 20 and having two memory modules 30 installed in the two edge connector sockets (not shown). With the edge connector assembly 10 secured in the operable position shown, each of the individual electrical leads 40 from a first edge connector socket is electrically connected to one of the contacts 24 on a first surface 21 of the printed circuit board 20. More specifically, the printed circuit board 20 has a first surface 21 with a plurality of contacts 24 along the edge 22 and arranged in a first row 28 and a second row 29. Similarly, the edge connector assembly 10 includes a plurality of electrical leads 40 extending from the first edge connector socket (not shown) and arranged in a first row 42 and a second row 44. The electrical leads 40 in the first row 42 of electrical leads make electrical contact with the contacts 24 in the first row 28 of contacts, and the electrical leads 40 in the second row 44 of electrical leads make electrical contact with the contacts 24 in the second row 29 of contacts. Preferably, each electrical lead 40 is soldered to a corresponding contact 24. Although not shown in FIG. 2, the edge connector assembly 10 has a second edge connector socket with a plurality of individual electrical leads, where each electrical lead electrically connects one contact within the second edge connector socket to a contact on a second surface of the printed circuit board 20.

Figure 3:
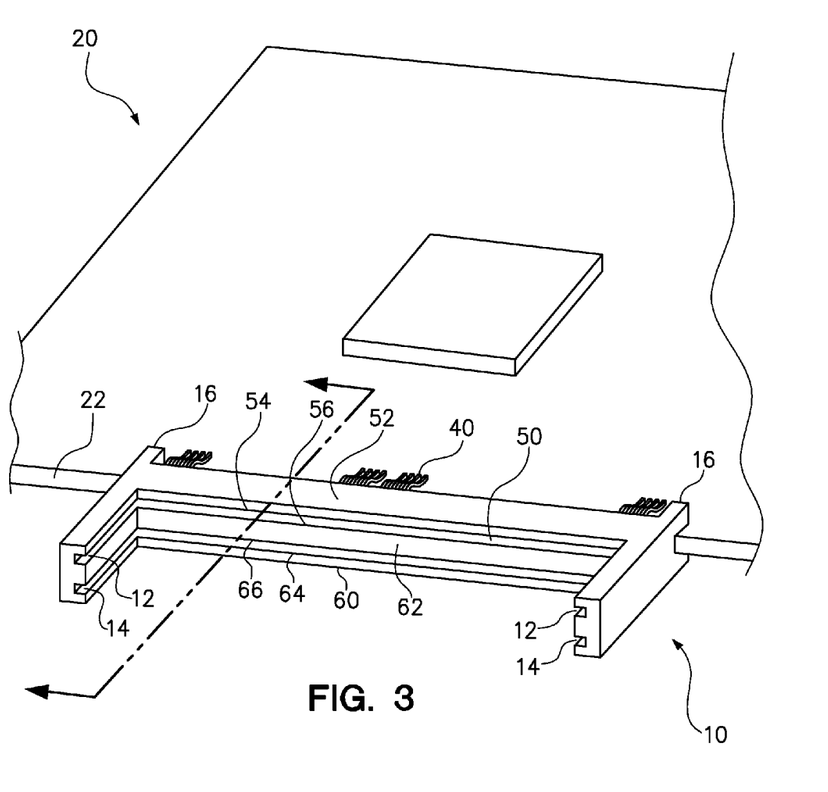
FIG. 3 is a perspective view of the edge connector assembly and printed circuit board of FIG. 2 from a different angle and without the memory modules in order to show the sockets formed in the edge connector assembly.

FIG. 3 is a perspective view of the edge connector assembly 10 coupled along the edge 22 of the printed circuit board 20 of FIG. 2 from a different angle and without the memory modules installed in order to show the first edge connector socket 50 and the second edge connector socket 60 formed in the edge connector assembly 10. Each edge connector socket may be of a conventional design including a plurality of contacts spaced apart along the length of the socket. The plurality of contacts includes a first row of contacts on a first side of the socket for making electrical contact with pads on a first side of a memory module and a second row of contacts on a second side of the socket for making electrical contact with pads on a second side of a memory module. In a preferred configuration, the first edge connector socket 50 includes a key 52 for dictating the orientation and type of memory module that may be installed in the socket 50, and the second edge connector socket 60 includes a key 62 for dictating the orientation and type of memory module that may be installed in the socket 60. As shown, the keys 52, 62 are arranged so that two memory modules installed in the first and second sockets 50, 60 can only be installed facing in opposite directions. The first and second pairs of tracks 12, 14 are aligned with the first and second sockets 50, 60, respectively, so that a memory module may slide in a pair of tracks for alignment with a socket. A first row of contacts 54 are spaced along a first side of the first socket 50 and a second row of contacts 56 are spaced along a second side of the first socket 50. Similarly, a first row of contacts 64 are spaced along a first side of the second socket 60 and a second row of contacts 66 are spaced along a second side of the second socket 60. Furthermore, the side edges of a memory module may be supported by a pair of tracks while installed.

Figure 4:
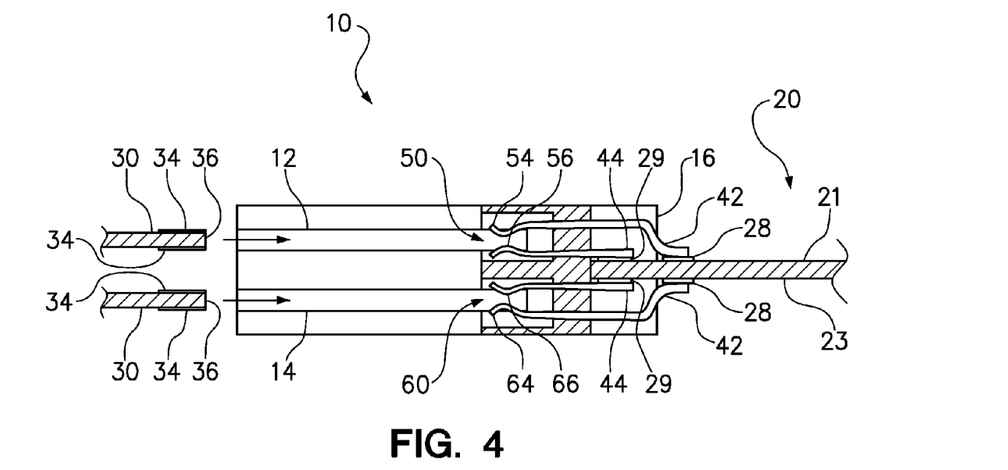
FIG. 4 is a cross-sectional side view of the edge connector assembly secured to the printed circuit board.

FIG. 4 is a cross-sectional side view of the edge connector assembly 10 secured to the printed circuit board 20. The edge connector assembly 10 includes the first edge connector socket 50 and the second edge connector socket 60. As shown, the edge 36 of a first memory module 30 is aligned to be slid in the first track 12 for installation in the first edge connector socket 50, and the edge 36 of a second memory module 30 is aligned to be slid in the second track 14 for installation in the second edge connector socket 60.

The first edge connector socket 50 has a first contact 54 coupled to an electrical lead 42 that is soldered to the contact 28 on the first surface 21 of the printed circuit board 20, and an opposing second contact 56 coupled to the electrical lead 44 that is soldered to the contact 29 on the first surface 21. Similarly, the second edge connector socket 60 has a first contact 64 coupled to an electrical lead 42 that is soldered to the contact 28 on a second surface 23 of the printed circuit board 20, and an opposing second contact 66 coupled to an electrical lead 44 that is soldered to the contact 29 on the second surface 23. Accordingly, each of the contacts 54, 56, 64, 66 is in electronic communication with one of the contacts on the printed circuit board. Furthermore, this cross-sectional side view shows that the electrical leads 42, 44 associated with the first edge connector socket 50 are the same length as the electrical leads 42, 44 associated with the second edge connector socket 60.

Figure 5:
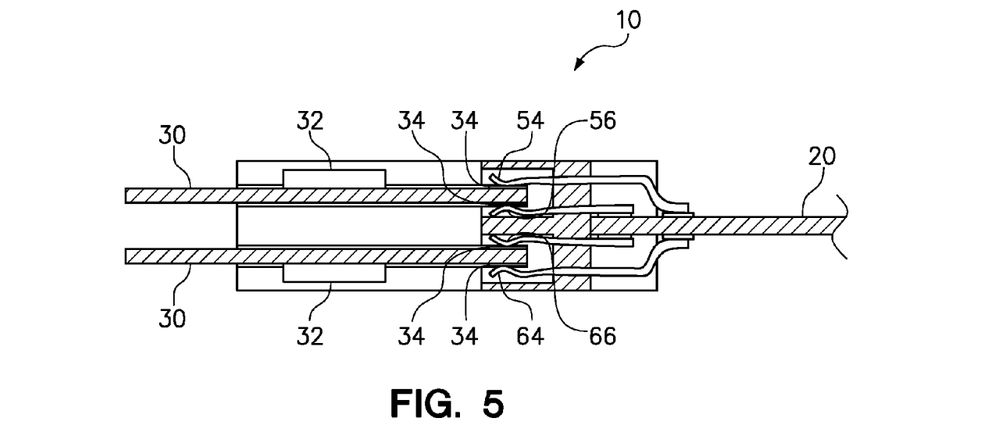
FIG. 5 is a cross-sectional side view of the edge connector assembly secured to the printed circuit board and having two memory modules installed.

FIG. 5 is a cross-sectional side view of the edge connector assembly 10 secured to the printed circuit board 20, as described in reference to FIG. 4, but having two memory modules 30 installed. Installing the memory modules 30 causes the contacts 54, 56, 64, 66 within the edge connector sockets 50, 60 to flex apart and wipe against the pads 34 of the memory modules 30. Once installed, the pads 34 on each side of both memory modules 30 are in electrical contact with the contacts 54, 56, 64, 66 so that the processor on the printed circuit board can store or retrieve information from the memory modules 30. As shown, the memory modules 30 are facing in opposite directions, such that the memory chips 32 are directed away from each other.

Figure 6:
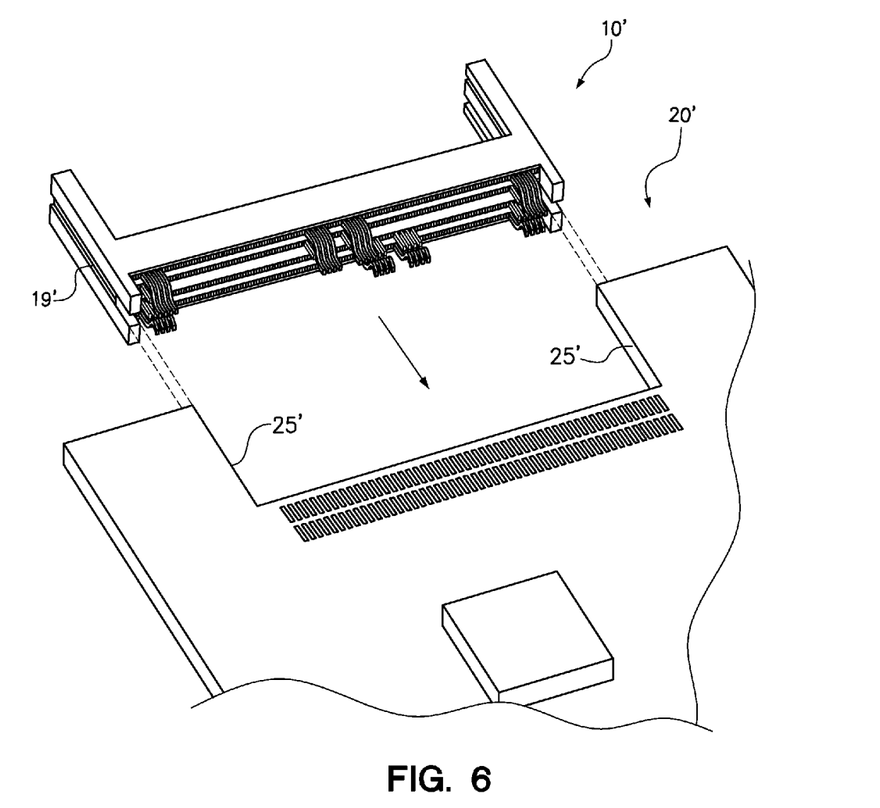
FIG. 6 is an assembly view of a second embodiment of an edge connector assembly aligned for securing to a printed circuit board.

FIG. 6 is an assembly view of a second embodiment of an edge connector assembly 10' aligned for securing to a printed circuit board 20'. The edge connector assembly 10' and the printed circuit board 20' are similar to the edge connector assembly 10 and printed circuit board 20 of FIGS. 1-5, except for a few specific details. As shown, the edge connector assembly 10' has outwardly facing tracks 19' (only one shown) on each side of the assembly for engaging and slidably receiving the two opposing edges 25' of a cutout portion of the printed circuit board 20'.

Figure 7:
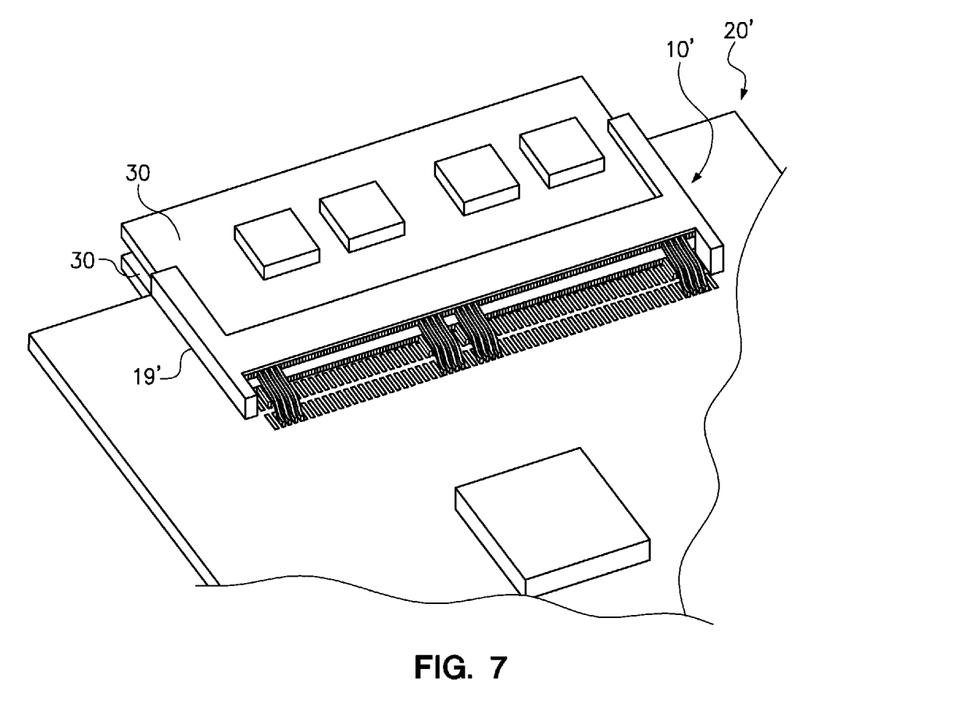
FIG. 7 is a perspective view of the second embodiment of the edge connector secured to the printed circuit board.

FIG. 7 is a perspective view of the second embodiment of the edge connector assembly 10' secured to the printed circuit board 20'. The outwardly facing tracks 19' have received, and are now supported by, the two opposing edges 25' of the printed circuit board 20'. The support that the edge connector assembly 10' receives from the printed circuit board 20' reduces stress on the solder connections formed between the electrical leads and the contacts on the printed circuit board. Furthermore, the memory modules 30 do not extend outwardly as far from the printed circuit board 20' in FIG. 7 as from the printed circuit board 20 in FIG. 2.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An apparatus comprising:
   a printed circuit board including a first plurality of contacts on a first surface of the printed circuit board and a second plurality of contacts on a second surface of the printed circuit board; and
   a memory module connector assembly physically secured along an edge of the printed circuit board, wherein the memory module connector assembly includes a first edge connector socket for receiving a first memory module, a second edge connector socket for receiving a second memory module, a first plurality of electrical leads electrically connecting contacts within the first edge connector socket to the first plurality of contacts on the first side of the printed circuit board, and a second plurality of electrical leads electrically connecting contacts within the second edge connector socket to the second plurality of contacts on the second side of the printed circuit board.

2. The apparatus of claim 1, wherein first plurality of electrical leads are the same length as the second plurality of electrical leads.

3. The apparatus of claim 1, further comprising:
a processor physically secured to the printed circuit board in electronic communication with the first plurality of contacts and the second plurality of contacts.

4. The apparatus of claim 1, wherein the first and second edge connector sockets open in a direction away from the edge of the printed circuit board to which the memory module connector assembly is physically secured.

5. The apparatus of claim 1, wherein the printed circuit board is planar, the first edge connector socket is positioned on a first side of a plane defined by the printed circuit board, and the second edge connector socket is positioned on a second side of a plane defined by the printed circuit board.

6. The apparatus of claim 5, wherein the first edge connector socket is parallel to the second edge connector socket.

7. The apparatus of claim 6, wherein the first and second edge connector sockets are parallel to the plane defined by the printed circuit board.

8. The apparatus of claim 1, wherein the first and second edge connector sockets are straight plug edge connector sockets.

9. The apparatus of claim 1, wherein the printed circuit board is a motherboard.

10. The apparatus of claim 1, wherein the printed circuit board is a motherboard of a server.

11. The apparatus of claim 1, wherein the first and second memory modules are small outline memory modules.

12. The apparatus of claim 1, wherein the first and second memory modules are dual inline memory modules.

13. The apparatus of claim 1, wherein the memory module connector assembly includes first and second brackets, each bracket including a notch for receiving the edge of the printed circuit board.

14. The apparatus of claim 1, wherein the first plurality of electrical leads are soldered to the first plurality of contacts on the first side of the printed circuit board, and the second plurality of electrical leads are soldered to the second plurality of contacts on the second side of the printed circuit board.

15. The apparatus of claim 1, wherein the first edge connector socket includes first and second opposing rows of contacts for engaging opposing sides of the first memory module, the first plurality of electrical leads include first and second rows of electrical leads, and the first plurality of contacts on the first surface of the printed circuit board include first and second rows of contacts, wherein the first row of electrical leads in the first plurality of electrical leads electrically connect the first row of contacts in the first edge connector socket to the first row of contacts on the first surface of the printed circuit board and the second row of electrical leads electrically connect the second row of contacts in the first edge connector socket to the second row of contacts on the first surface of the printed circuit board.

16. The apparatus of claim 15, wherein the second edge connector socket includes first and second opposing rows of contacts for engaging opposing sides of the second memory module, the second plurality of electrical leads include first and second rows of electrical leads, and the second plurality of contacts on the second surface of the printed circuit board include first and second rows of contacts, wherein the first row of electrical leads in the second plurality of electrical leads electrically connect the first row of contacts in the second edge connector socket to the first row of contacts on the second surface of the printed circuit board and the second row of electrical leads in the second plurality of electrical leads electrically connect the second row of contacts in the second edge connector socket to the second row of contacts on the second surface of the printed circuit board.

17. The apparatus of claim 1, wherein the first edge connector socket includes a first key and the first memory module includes a first notch that only aligns with the first key when the first memory module is in a first orientation, wherein the second edge connector socket includes a second key and the second memory module includes a second notch that only aligns with the second key when the second memory module is in a second orientation.

18. The apparatus of claim 17, wherein the first and second keys only allows the first and second memory modules to be installed with the first memory module facing in an opposite direction from the second memory module.

* * * * *